United States Patent [19]

Narayanan et al.

[11] Patent Number: 5,774,474
[45] Date of Patent: Jun. 30, 1998

[54] PIPELINED SCAN ENABLE FOR FAST SCAN TESTING

[75] Inventors: Sridhar Narayanan; Marc E. Levitt, both of Sunnyvale, Calif.

[73] Assignee: Sun Microsystems, Inc., Palo Alto, Calif.

[21] Appl. No.: 616,112

[22] Filed: Mar. 14, 1996

[51] Int. Cl.[6] .................................................. G01R 31/28
[52] U.S. Cl. ..................................................... 371/22.31
[58] Field of Search ............................ 371/22.31, 22.1, 371/22.2, 22.5, 22.6, 22.36, 22.32; 364/934, 934.4

[56] References Cited

U.S. PATENT DOCUMENTS 4,542,509  9/1985  Buchanan et al. ................... 371/22.1
5,235,600  8/1993  Edwards .............................. 371/22.3

*Primary Examiner*—Hoa T. Nguyen
*Attorney, Agent, or Firm*—Beyer & Weaver, LLP

[57] ABSTRACT

High speed scan testing is facilitated by pipelining or distributing a scan enable signal to scan circuits through a distribution network. The pipeline is formed from a plurality of scan enable distribution circuits residing on an integrated circuit to be scan tested. Preferably, before reaching the scan circuits, the scan enable signal passes through an equal number of the scan enable distribution circuits. The distribution network of the scan enable distribution circuits take a multitude of forms. The invention allows at-speed toggling of a scan enable signal as well as shifting of test data at functional system frequencies, while maintaining compatibility with test modes such as IEEE Standard 1149.1. The invention is also capable of supporting skewed-load and broad-side delay test modes.

18 Claims, 8 Drawing Sheets

PIPELINED SCAN ENABLE FOR FAST SCAN TESTING

BACKGROUND OF THE INVENTION

1. Field of the Invention

The present invention relates to integrated circuit testing, and more particularly, to scan testing of integrated circuits.

2. Description of the Related Art

During design of an integrated circuit, the design (typically a software modeled design) is extensively tested for proper functioning. The testing at this stage of development is known as design verification testing.

Although integrated circuit designs are thoroughly tested during the design phase, once the integrated circuits are fabricated, they must be individually tested for manufacturing defects as well as for operation and functional criteria. Examples of manufacturing defects are pins or lines that are "stuck" high or low. The operation and functional criteria depend on the particular design of the integrated circuits.

One popular method for providing individual testing is referred to as "scan testing" in which a serial stream of data is propagated through a plurality of serial connected scan flip-flops within the integrated circuit being tested. The scan flip-flops are connected in series to form a long shift register known as a scan chain. After the scan flip-flops are loaded, the data output from some or all of these scan flip-flops propagates through the logic of the integrated circuit and then the output of the logic is captured in the scan flip-flops in the scan path. This data is then shifted out from the integrated circuit for observation.

In testing an integrated circuit, the board-level test environment imposes greater constraints than does stand alone testing of the circuit in an Automatic Test Equipment (ATE) tester environment. The test architecture and scan chain logic of a JTAG (Joint Task Action Group) or 1149.1 compatible device is often designed based on the capabilities and limitations of the board-level test strategy. The drawback, however, is that making the test architecture and scan chain logic JTAG compatible limits both the effectiveness and efficiency in isolated testing of the integrated circuit on an ATE tester.

At the board-level, a TAP controller on an integrated circuit is responsible for generating the clock and control signals for any operations performed in the test mode. The shifting of test data and the capture of results for every test pattern is controlled by transitions in a TAP state diagram. See IEEE Standard Test Access Port and Boundary Scan Architecture, IEEE Standard 1149.1 (1990), which is hereby incorporated by reference. Specifically, the TAP controller is responsible for the assertion and deassertion of a scan enable signal, based on transitions in its TAP state diagram. The scan enable signal is a global signal that feeds every scan flop in the design. The speed at which the scan enable signal can toggle is important for at-speed testing as well as for certain modes of delay testing such as broad-side delay testing and skewed-load delay testing.

Use of the TAP controller for scan operations at the ATE tester, in the same manner as at the board-level, has the following disadvantages. First, the design of the TAP controller is optimized to support the frequency of the test clock at the board-level. This limits the speed at which shift operations can be performed at the ATE tester which is capable of operating faster than the TAP controller. Second, both the manner and speed with which the TAP controller toggles the scan enable makes it difficult to support these forms of testing such as skewed-load delay testing. See, e.g., Prab Varma, "On Path Delay Testing in a Standard Scan Environment," Proc. Int'l Test Conf., pages 164–173, October 1994. Third, special hardware features must be included in the design of the TAP controller to support broad-side delay scan testing. This requirement for special hardware is disadvantageous because it adds to the complexity of the TAP controller and increases the area overhead. See, e.g., Hong Hao, IEEE 1149.1 Specification and TAP Design of the SuperSparc II; and Marc Levitt, IEEE 1149.1 Specification of the UltraSparc.

The rate of shifting test data into the scan chain depends on the frequency of the test clock. Since the frequency of the test clock at the board-level is often less than the functional system frequency of the integrated circuit during normal operation, the scan chain architecture and routing of internal control signals typically only support the slower clock frequency for board-level testing. Consequently, scan testing can only be achieved at these slower frequencies even though an ATE tester is capable of providing clock and other signal at much faster frequencies.

There are, however, a number of advantages to shifting test data into the scan chain(s) at functional clock frequencies, or possibly at greater speeds. First, higher clock speeds translate to reduced test application time, and hence increase the efficiency and decrease the costs of tester usage. Second, shifting the test data through the scan chain at system frequencies facilitates certain at-speed testing modes of the integrated circuit. This provides greater coverage of defects such as delay faults and stuck-open faults.

Even if the conventional architecture and scan logic were operated at higher speeds, it would not operate properly because the scan chain architecture and routing of internal control signals are not designed to support such higher clock frequencies. In particular, one drawback with conventional scan testing is that the speed at which the scan flip-flops can be switched between a normal functional mode and a test mode is limited due to the delay associated with propagating a select signal to all areas of the integrated circuit. As a result, conventional scan testing must operate at a low speed which is burdensome, particularly considering the serial nature of scan testing.

Thus, there is a need for ways to improve the speed at which scan testing of manufactured integrated circuits can be implemented.

SUMMARY OF THE INVENTION

Broadly speaking, the invention relates to improved scan testing techniques in which a scan enable signal is pipelined to scan circuits through a distribution network so as to facilitate high speed scan testing. The invention may be implemented in numerous ways, including as an apparatus and a method.

As an integrated circuit chip supporting scan testing in a test mode and functional operation in a functional mode, an embodiment of the invention includes: functional circuitry; a plurality of scan circuits residing on the integrated circuit chip, the scan circuits being coupled to the functional circuitry in the functional mode and being coupled to one another to form at least one serial chain in the test mode; and a plurality of scan enable distribution circuits residing on the integrated circuit for distributing a scan enable signal to the scan circuits, the scan enable signal being operable to switch the scan circuits between the test mode and the functional mode. The scan enable signal passes through a predetermined number of the scan enable distribution circuits before reaching the scan circuits. The organization of the scan enable distribution circuits take a multitude of forms.

As an integrated circuit chip having a pipelined scan architecture, another embodiment of the invention includes: a plurality of scan circuits, each of the scan circuits including at least a data input terminal, a clock terminal, a scan enable terminal, a scan data input terminal, and an output terminal; and a plurality of scan enable distribution circuits. A scan enable signal passes through a predetermined number of the scan enable distribution circuits prior to reaching the scan enable terminals of the scan circuits.

As a method for scan testing an integrated circuit chip having functional logic, an embodiment of the invention includes the operations of: providing a plurality of scan circuits within the integrated circuit chip, each of the scan circuits having a functional mode and a scan mode; providing a plurality of scan enable distribution circuits within the integrated circuit chip, the scan enable distribution circuits being distributed within the integrated circuit; receiving a scan enable signal; supplying the scan enable signal to each of the scan circuits through the scan enable distribution circuits so that the scan enable signal in route to the scan circuits passes through an equal number of the scan enable distribution circuits; setting the scan circuits to the scan mode using the scan enable signal; receiving test data; shifting the test data through the scan circuits; setting the scan circuits to the functional mode using the scan enable signal; obtaining resultant data from the functional logic of the integrated circuit; setting the scan circuits to the scan mode using the scan enable signal; and shifting out the resultant data.

As a scan enable distribution circuit for distributing a scan enable signal within an integrated circuit, and in which the scan enable distribution circuit enables the integrated circuit to be scan tested in a fast mode or in a slow mode, an embodiment of the scan enable distribution circuit includes: a sequential circuit having an input terminal receiving an input scan enable signal, a clock terminal for receiving a clock signal, and an output terminal; and a selector having a first input terminal receiving the input scan enable signal, a second input terminal coupled to the output terminal of the sequential circuit, a select terminal for receiving a scan mode select signal that selects one of the fast mode and the slow mode, and an output terminal for outputting an output scan enable signal. In the slow mode, the output scan enable signal is the input scan enable signal, and in the fast mode, the output scan enable signal is the signal output from the output terminal of the sequential circuit.

Several of the advantages of the invention are as follows. The invention allows at-speed toggling of a scan enable signal as well as shifting of test data at functional system frequencies. The invention is also capable of supporting skewed-load and broad-side delay test modes. Further, use of the invention only minimally impacts the design of a TAP controller for board-level testing and compatibility with test modes such as IEEE 1149.1 standard used at the board-level can be maintained.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE INVENTION

Figure 1:
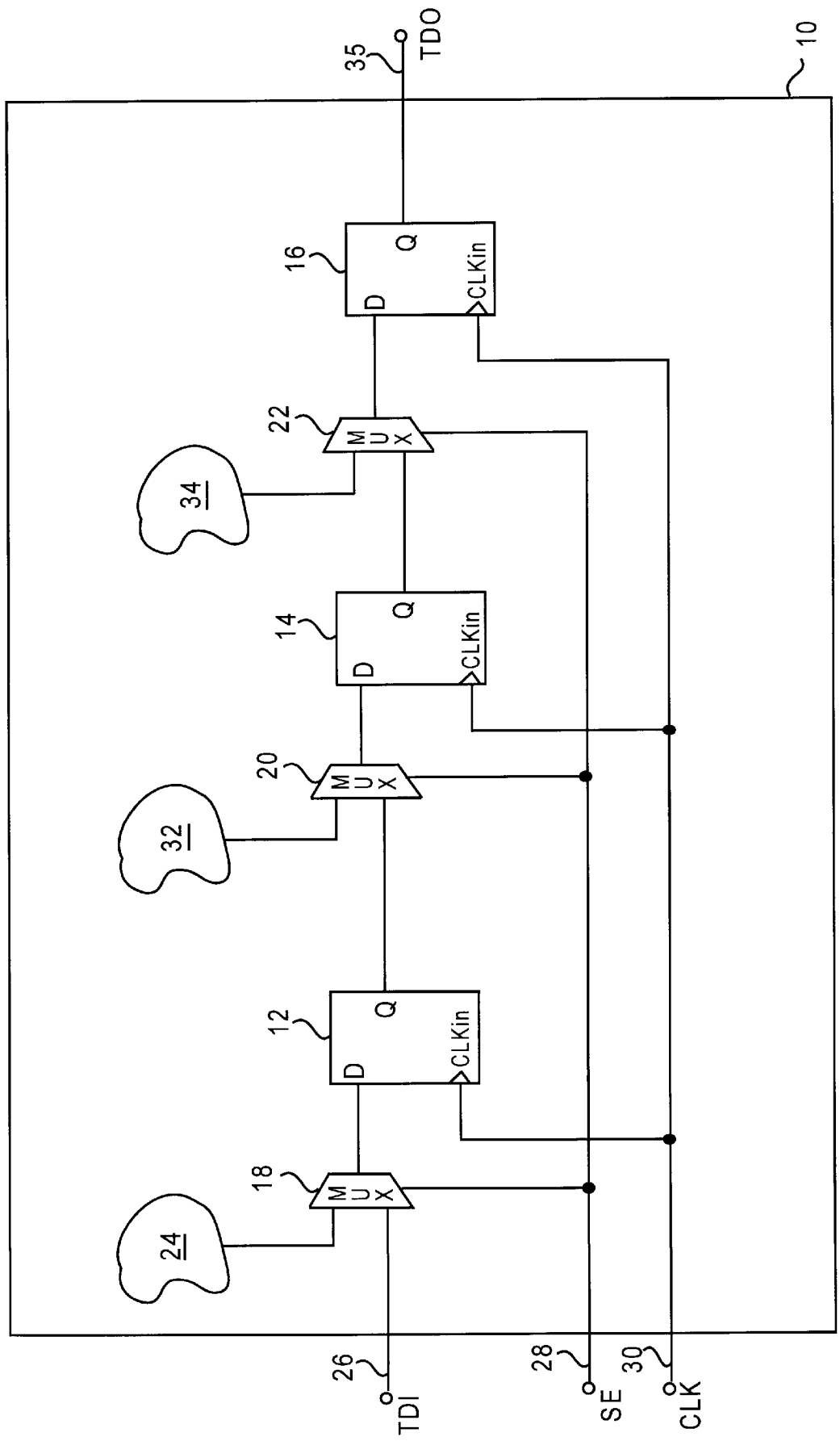
FIG. 1 is a block diagram of an integrated circuit to be tested using conventional scan testing.

FIG. 1 is a block diagram of an integrated circuit chip 10 to be tested using conventional scan testing techniques. The integrated circuit chip 10 is manufactured to include flip-flops 12, 14 and 16. The flip-flops 12, 14 and 16 are conventional D-type flip-flops which typically themselves form part of the functional logic designed into the integrated circuit chip 10. However, to support scan testing, these flip-flops 12, 14 and 16 are designed to receive their inputs respectively from multiplexers 18, 20 and 22. Hence, the flip-flop and its associated multiplexer together form a scan flip-flop (also referred to as a scan circuit).

The multiplexer 18 receives a first input from functional logic 24 associated with and forming part of the integrated circuit chip 10, and receives a second input from an external data source on pin 26 of the integrated circuit chip 10. The external data source supplies Test Data In (TDI) to pin 26 of the integrated circuit chip 10. The TDI is the serial data stream being supplied to the integrated circuit chip 10 for scan testing. Typically, the external data source is from an Automatic Test Equipment (ATE) tester or a board-level tester. Pin 28 of the integrated circuit chip 10 receives a scan enable signal (SE) for the integrated circuit chip 10. The scan enable signal (SE) is then sent to each of the multiplexers 18, 20 and 22. Pin 30 of the integrated circuit chip 10 receives a clock signal (CLK) for the integrated circuit chip 10.

The multiplexer 18 supplies either the data supplied from the functional logic 24 or the TDI to the input terminal (D) of the flip-flop 12 depending on the signal level of the scan enable signal (SE). The clock signal (CLK) is supplied to the clock input terminal (CLKin) of the flip-flop 12. As is conventional with flip-flops, at a rising (or falling) edge of the clock signal (CLK), the data value at the input terminal (D) of the flip-flop 12 is latched into the storage cell of the flip-flop 12 and the stored data value appears at an output terminal (Q) of the flip-flop 12.

The multiplexer 20 receives a first input from functional logic 32 and a second input from the output terminal (Q) of the flip-flop 12. The scan enable signal (SE) controls the multiplexer 20 to supply one of the first and second inputs to an input data terminal (D) of the flip-flop 14. The clock signal (CLK) is also supplied to a clock input terminal (CLKin) of the flip-flop 14. At a rising (or falling) edge of the clock signal (CLK), the data value at the input terminal (D) of the flip-flop 14 is latched into the storage cell of the flip-flop 14 and the stored data value appears at an output terminal (Q) of the flip-flop 14.

The multiplexer 22 receives a first input from functional logic 34 and a second input from the output terminal (Q) of the flip-flop 14. The scan enable signal (SE) controls the multiplexer 22 to supply one of the first and second inputs to an input data terminal (D) of the flip-flop 16. The clock signal (CLK) is supplied to the clock input terminal (CLKin) of the flip-flop 16. The output terminal (Q) of the flip-flop 16 is associated with an output pin 35 of the integrated circuit chip 10 which outputs Test Data Out (TDO). The TDO is the serial data stream output from the integrated circuit chip 10 as a result of the scan testing.

Of course, during scan testing, the scan data must satisfy predetermined set-up and hold times associated with the circuitry of the scan chain. Such set-up and hold requirements are particularly important with high-speed testing.

Hence, the integrated circuit 10 can be tested after fabrication using scan testing because it was designed to include pins to receive TDI, SE and TDO as well as multiplexers 18, 20 and 22 with appropriate connections. The flip-flops 12, 14 and 16 and their respective multiplexers 18, 20 and 22 form scan flip-flops. In a test mode, the scan enable signal (SE) causes the multiplexers 18, 20 and 22 to supply the respective data input terminal (D) with scan test data. In contrast, in a functional mode, the scan enable signal (SE) causes the multiplexers 18, 20 and 22 to supply the respective data input terminal with data from the functional logic 24, 32 and 34 of the integrated circuit chip 10.

The standard method to apply test patterns to an integrated circuit with a single scan chain consists of the following steps. A test pattern is shifted into the scan chain by activating the scan enable signal (SE) for all scan flip-flop in the chain. At the end of the shift sequence, the scan enable signal is deasserted. A single clock is then applied to permit the functional result of the shift pattern to be latched in the data inputs to all the scan flip-flops. The functional results are then shifted out while simultaneously shifting in the next test pattern. At the top level of the design, two ports are provided to scan in and scan out test data, respectively. The use of a single clock between shift sequences is used to test for defects such as stuck-at faults in an integrated circuit. At the end of the shift sequence, rather than a single clock, two clock cycles can be applied before data is shifted out. This causes signal transitions to be launched along certain logic paths in the design, and can test for faults such as delay faults and stuck-open faults. The first of the two clock cycles can either be a shift-clock cycle with scan enable asserted (which is referred to as skewed load delay testing) or a system clock cycle with scan enable deasserted (which is referred to as broad side or functional justification based delay testing). In both cases however, the second clock cycle should occur at the rated system speed after the first cycle.

The scan testing of an integrated circuit can take place in a number of different settings. In particular, the integrated circuit can be tested either stand-alone on automatic test equipment (ATE) tester or as part of system tests once it is mounted on a module or board. In the former case, the tester has direct access to the pins of the integrated circuit. In addition, ATE testers can provide high frequency clock signals used as part of functional testing of the integrated circuit. Once the integrated circuit is mounted on a board, in-circuit methods of testing must be used to access the pins of the integrated circuit. If the integrated circuit is designed to be compatible with IEEE 1149.1 standard, it can be tested by the methodology provided by this standard. This includes the use of a test bus consisting of 4 (or 5) signals, and the use of a Test Access Port (TAP) controller on the integrated circuit. The test bus is used to transmit test data and control signals and also to provide the test clock (TCK). The TAP controller in tandem with other test logic on the integrated circuit is responsible for generating the appropriate clock and control signals for the scan testing. The frequency of the test clock (TCK) used at the board level is limited by both the capabilities of current in-circuit testers and the inductance-capacitance effects of the clock routing at the board level. As a result, the test clock used at the board level is generally less than the system clock frequency used in normal functional modes.

Figure 2:
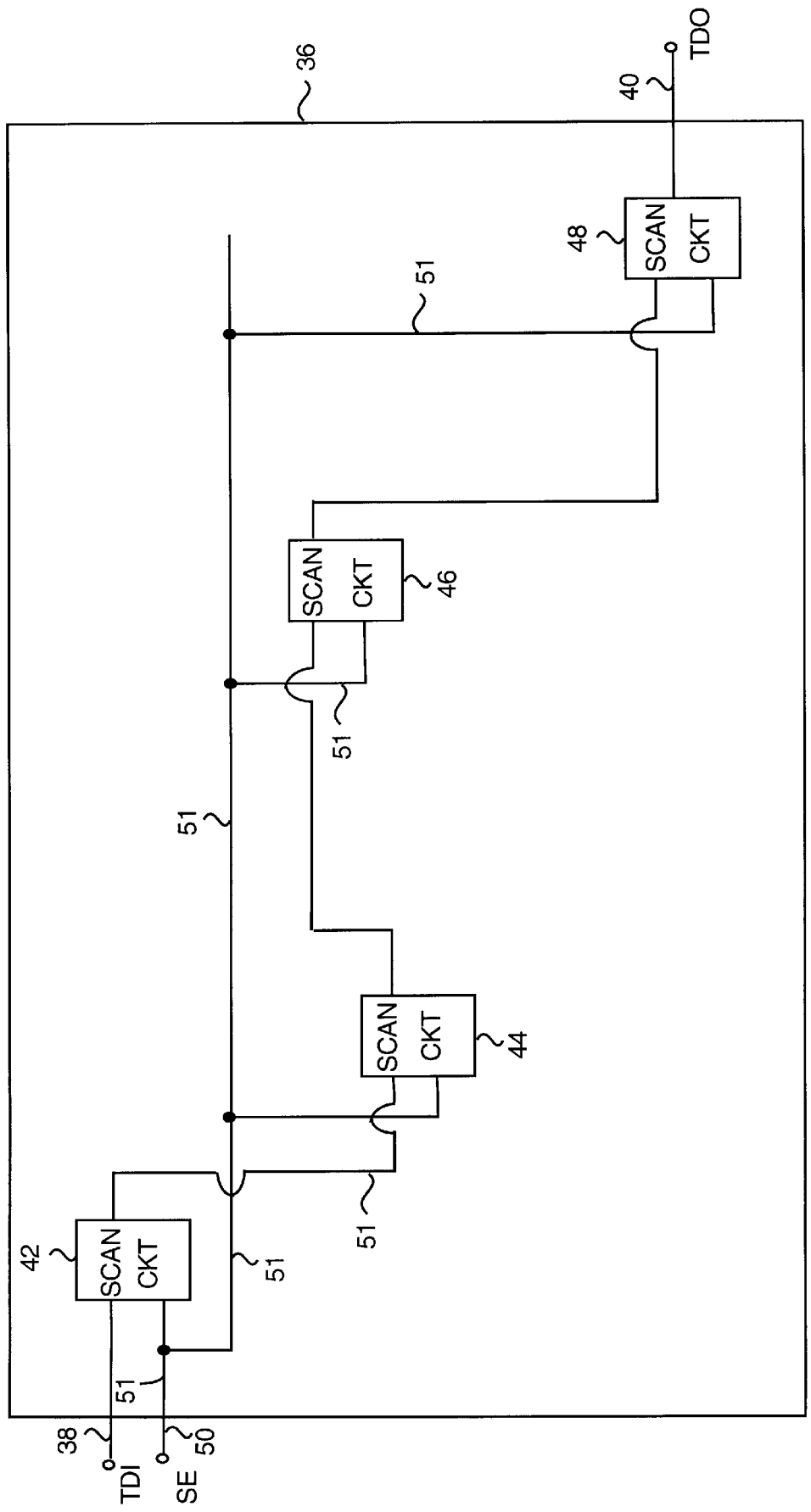
FIG. 2 is a block diagram illustrating conventional distribution of a scan enable signal within an integrated circuit chip.

FIG. 2 is a block diagram illustrating conventional distribution of a scan enable signal (SE) within an integrated circuit chip 36. In support of scan testing, the integrated circuit chip 36 receives Test Data In (TDI) on pin 38 and outputs Test Data Out (TDO) on pin 40. The integrated circuit chip 36 also includes scan circuits 42, 44, 46 and 48. As shown in FIG. 2, the scan circuits 42, 44, 46 and 48 are coupled to form a scan chain through the integrated circuit chip 36. Those skilled in the art will recognize that typical scan chains include thousands or tens of thousands of scan circuits within a scan chain. In addition, the scan circuits might be placed in more than one scan chain. Here, for ease of illustration, only four scan circuits are within a single scan chain.

The integrated circuit chip 36 receives the scan enable signal (SE) on pin 50. The scan enable signal (SE) must be supplied from pin 50 to each of the scan circuits 42, 44, 46 and 48 35 within the scan chain. The distribution of the scan enable signal (SE) is achieved with wiring 51 within the integrated circuit chip 36. However, due to the fact that the length of wiring 51 required to supply the scan enable signal (SE) to the individual scan circuits 42, 44, 46 and 48 within the integrated circuit chip 36 can vary greatly, the delay associated with supplying of the scan enable signal (SE) to the individual scan circuits 42, 44, 46 and 48 will likewise vary. In the example illustrated in FIG. 2, the length of wiring to supply the scan enable signal (SE) to the scan circuits 42, 44, 46 and 48 varies largely depending upon how far the position of the scan circuit differs from the position of the pin 50 which receives the scan enable signal (SE). As is clearly illustrated in FIG. 2, the wiring 51 to the scan circuit 48 is considerably longer than that to the scan circuit 42. In fact, the delay associated with receiving the scan enable signal (SE) at the scan circuits is shortest for the scan circuit 42, longer for the scan circuit 44, even longer for scan circuit 46, and longest for scan circuit 48.

Consequently, the delay at which transitions on the scan enable signal (SE) are seen at the respective scan circuits is not uniform. However, conventional designs are not able to operate the scan enable signal (SE) at a fast rate because the signal needs time to fully propagate to all the scan circuits within the integrated circuit chip. Hence, the rate at which the scan enable signal (SE) changes is constrained by the worst cast propagation delay to any individual scan circuit.

Embodiments of the invention are discussed below with reference to FIGS. 3–7. However, those skilled in the art will readily appreciate that the detailed description given herein with respect to these Figures is for explanatory purposes as the invention extends beyond these limited embodiments.

Figure 3:
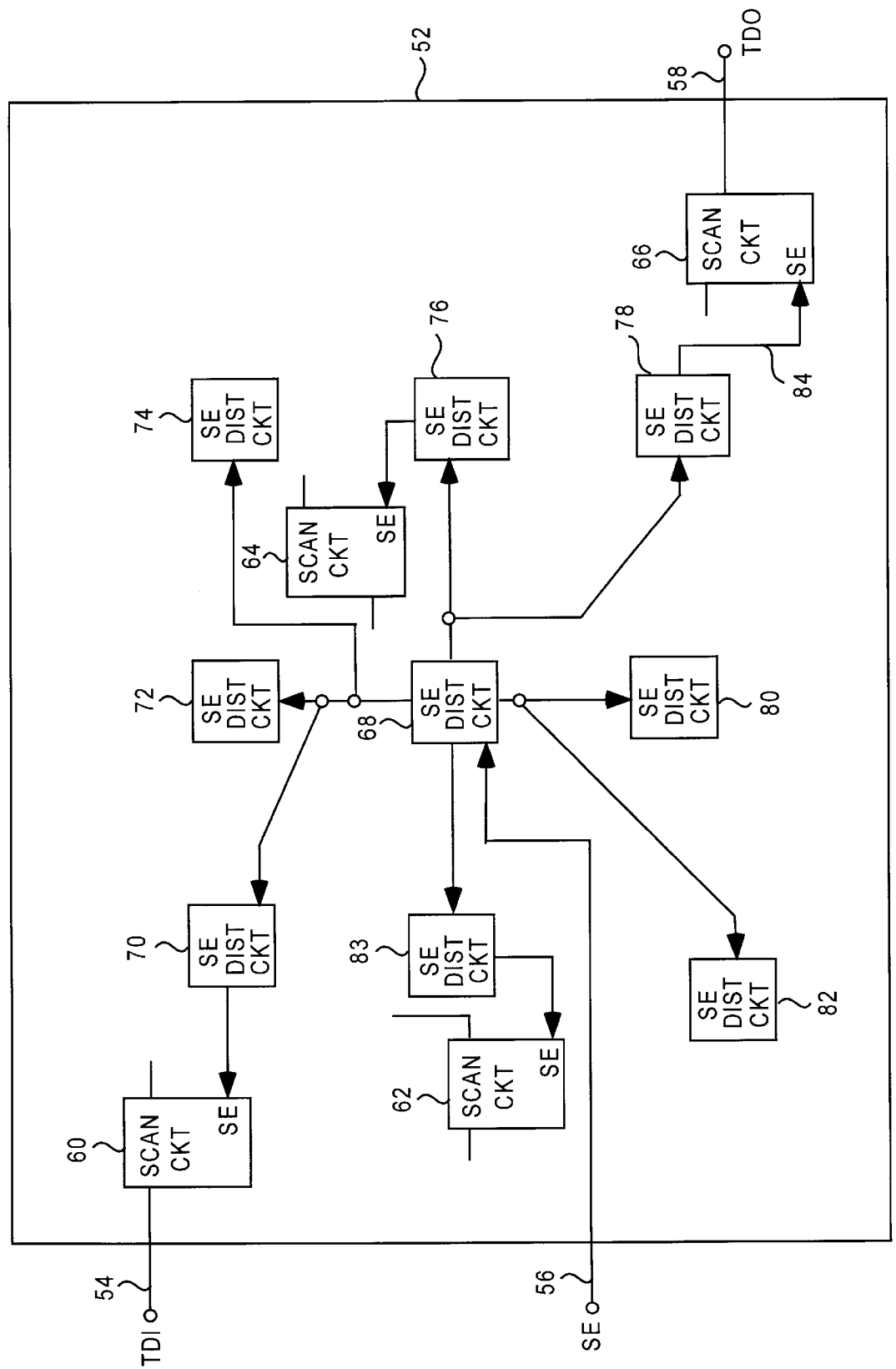
FIG. 3 is a block diagram of an integrated circuit that supports high-speed scan testing in accordance with a first embodiment of the invention.

FIG. 3 is a block diagram of an integrated circuit chip 52 that supports high-speed scan testing in accordance with a first embodiment of the invention. The integrated circuit chip 52 receives Test Data In (TDI) on pin 54 and receives a scan enable signal (SE) on pin 56. Test Data Out (TDO) is output on pin 58 of the integrated circuit chip 52. The integrated circuit chip 52 includes scan circuits 60, 62, 64 and 66 dispersed throughout the surface area of the integrated circuit chip 52. These scan circuits 60, 62, 64 and 66 are coupled together serially to form a scan chain when operated in a test mode. The serial chain connections for test data and clock signal (CLK) are not illustrated in FIG. 3 but would be similar to those shown in FIG. 1. Instead, because a feature of the invention is the distribution of the scan enable signal (SE) throughout the integrated circuit chip 52 to facilitate high-speed scan testing, FIG. 3 concentrates on illustrating this feature.

To provide distribution of the scan enable signal (SE) throughout the integrated circuit chip 52, the integrated circuit chip 52 includes a plurality of scan enable distribution circuits. In the arrangement of the distribution circuits shown in FIG. 3, a central scan enable distribution circuit 68 is located at the center region of the integrated circuit 52. The scan enable signal (SE) received at pin 56 is supplied to the central scan enable distribution circuit 68. Then, the central scan enable distribution circuit 68 forwards the scan enable signal (SE) to a second tier of scan enable distribution circuits. In this embodiment, the second tier of scan enable distribution circuits surround the central scan enable distribution circuit 68 (which is by itself the first tier). The scan enable distribution circuits in the second tier include scan enable circuits 70, 72, 74, 76, 78, 80, 82 and 83. Here, the scan enable distribution circuits in the first tier (e.g., the central scan enable distribution circuit 68) would supply the scan enable signal (SE) directly to each of the scan distribution circuits 70, 72, 74, 76, 78, 80, 82 and 83 of the second tier which are all located proximate thereto. Hence, the extent to which the scan enable signal (SE) is delayed (i.e., length of wire the scan enable signal (SE) must traverse) is limited since the signal need only pass to the next scan distribution circuit in a clock cycle.

Thereafter, the scan enable distribution circuits 68, 70, 72, 74, 76, 78, 80, 82 and 83 supply the scan enable signal (SE) to the scan circuits 60, 62, 64 and 66. As shown in FIG. 3, the scan enable distribution circuit 70 supplies the scan enable signal (SE) to the scan circuit 60, the scan enable distribution circuit 83 supplies the scan enable signal (SE) to the scan circuit 62, the scan enable distribution circuit 76 supplies the scan enable signal (SE) to the scan circuit 64, and the scan enable distribution circuit 78 supplies the scan enable signal (SE) to the scan circuit 66. In general, the scan enable distribution circuit closest to a particular scan circuit is preferably used to supply the scan enable signal (SE) to the scan circuit. Also, each scan enable distribution circuit is capable of supplying the scan enable signal (SE) to a plurality of scan circuits that are located close to the scan enable distribuiton cirucuit.

Although the overall delay time for the scan enable signal (SE) to propagate from pin 56 to the scan circuits 60, 62, 64 and 66 is not itself shortened (and even perhaps slightly lengthened), the scan enable signal (SE) is being pipelined to the various parts of the surface area of the integrated circuit chip 52 using the scan enable distribution circuits 68–83. At each stage of the pipeline there is a scan enable distribution circuit. The scan enable distribution circuits receive and synchronize with the clock signal (CLK). With each period of the clock signal (CLK), the scan enable signal (SE) propagates to the next stage in the pipeline. As a result, the scan enable signal (SE) at most need only propagate through a much shorter wire than conventionally possible, which means that the scan enable signal (SE) can be changed (i.e., clocked) at a substantially greater rate than conventionally possible. Although the distribution of the scan enable signal (SE) by the scan enable distribution circuits can take numerous forms or arrangements, the number of the scan enable distributions through which the scan enable signal (SE) passes prior to reaching each of the scan circuits should be the same.

Figure 4:
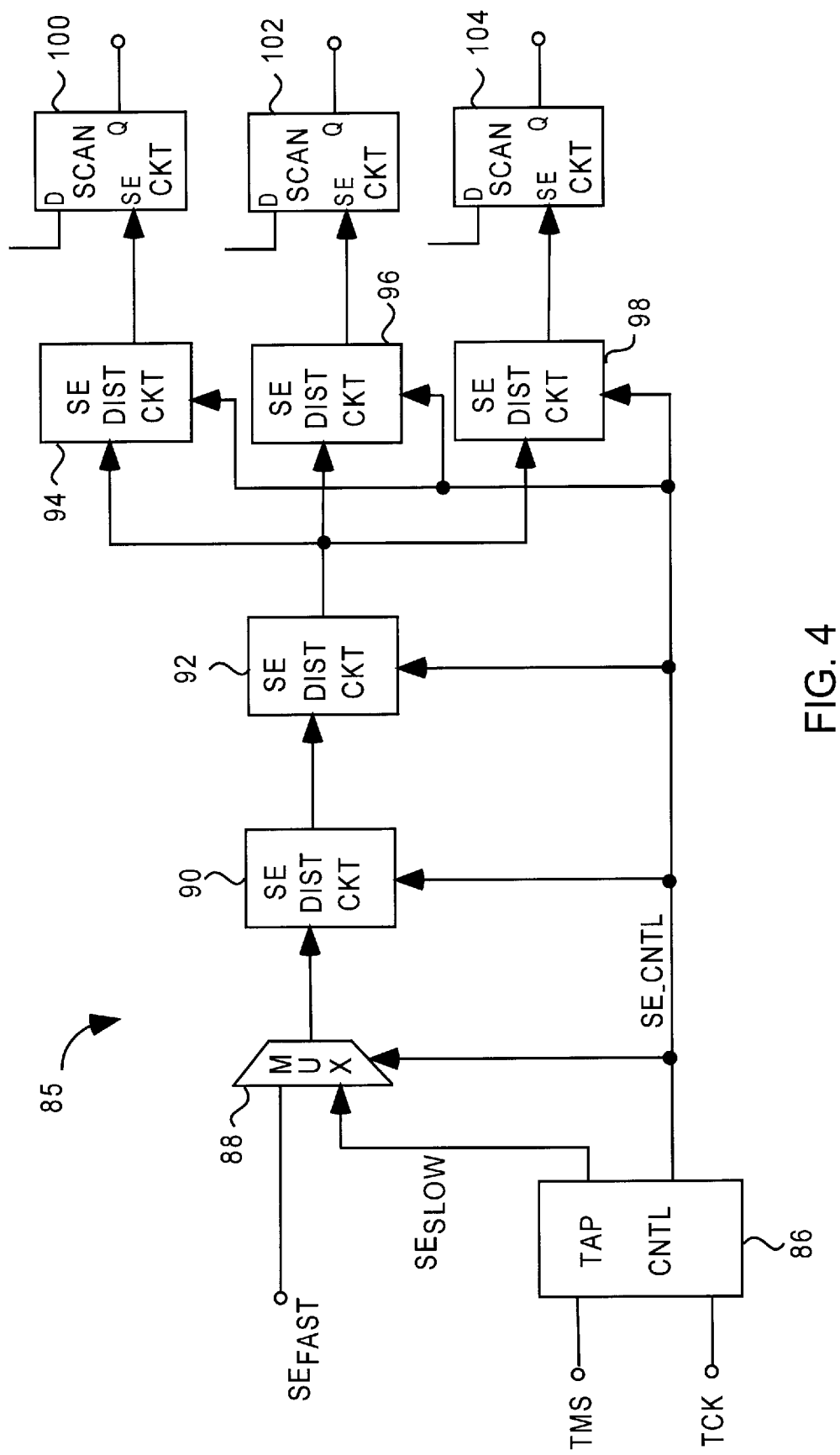
FIG. 4 is a block diagram of an integrated circuit that supports high-speed scan testing in accordance with a second embodiment of the invention.

FIG. 4 is a block diagram of an integrated circuit 85 that supports high-speed scan testing in accordance with a second embodiment of the invention. The integrated circuit 85 includes a Test Access Port (TAP) controller 86 within the integrated circuit 85 to provide circuit board testing using scan techniques in accordance with IEEE 1149.1 standard. A test bus signal (TMS) is used to transmit control signals to the TAP controller 86. A test clock (TCK) provides a system clock for clocking the testing operations. The TAP controller 86 in tandem with other test logic on the integrated circuit 85 is responsible for generating the appropriate data and control signals for the scan chain. The frequency of the test clock (TCK) used for board level testing is limited by the capabilities of current in-circuit testers as well as the inductance-capacitance effects of the clock routing at the board level. As a result, the test clock (TCK) used at the board level is generally less than a system clock frequency used in a normal functional mode. The clocks for the scan circuits as well as the scan enable distribution circuits are provided via the same distribution scheme used for the normal functional clock. This normal functional clock is already within the integrated circuit design so that it supports high-speed normal operation. This distribution scheme will be optimized to enable high speed operation. Clock care distribution and options for spped requires for normal funciton mode of integrated circuit.

Besides the TAP controller 86, the integrated circuit 85 also includes a multiplexer 88. The multiplexer 88 receives a fast scan enable signal ($SE_{FAST}$) and a slow scan enable signal ($SE_{SLOW}$). A select enable control signal (SE_CNTL) supplied by the TAP controller 86 determines which of the inputs the multiplexer 88 outputs to a scan enable distribution circuit 90. The scan enable distribution circuit 90 supplies its output to a scan enable distribution circuit 92 which in turn supplies its output to scan enable distribution circuit 94, 96 and 98. The scan enable distribution circuits 90, 92, 94, 96 and 98 form a scan enable distribution network for distributing the scan enable signal throughout the integrated circuit 85. The output of the scan enable distribution circuit 94 is coupled to a scan enable terminal (SE) of a scan circuit 100. The output of the scan enable distribution circuit 96 is coupled to a scan enable terminal (SE) of the scan circuit 102. The output of the scan enable distribution circuit 98 is supplied to the scan enable terminal (SE) of the scan circuit 104. The scan enable control signal (SE_CNTL) supplied by the TAP controller 86 is supplied to each of the scan enable distribution circuits 90–98 to induce operation in either a slow scan test mode or a fast scan test mode.

In the slow scan test mode, the integrated circuit 85 will perform scan testing much like that done conventionally. Namely, in the slow scan test mode, the rate of change of the scan enable signal is slow ($SE_{SLOW}$) so that it has time to propagate to all the scan circuits within the integrated circuit 85. However, during the fast scan test mode, the scan enable signal ($SE_{FAST}$) is switched at a much faster rate and it is pipelined through successive stages of the scan enable distribution circuits 90–98 to reach the scan circuits 100, 102 and 104. In effect, the scan enable signal is being pipelined to the scan circuits 100, 102 and 104. Thus, the integrated circuit 85 can be tested in a fast scan test mode on an ATE tester, while being compatible with the slow scan test mode at the board-level controlled by the TAP controller.

Figure 5:
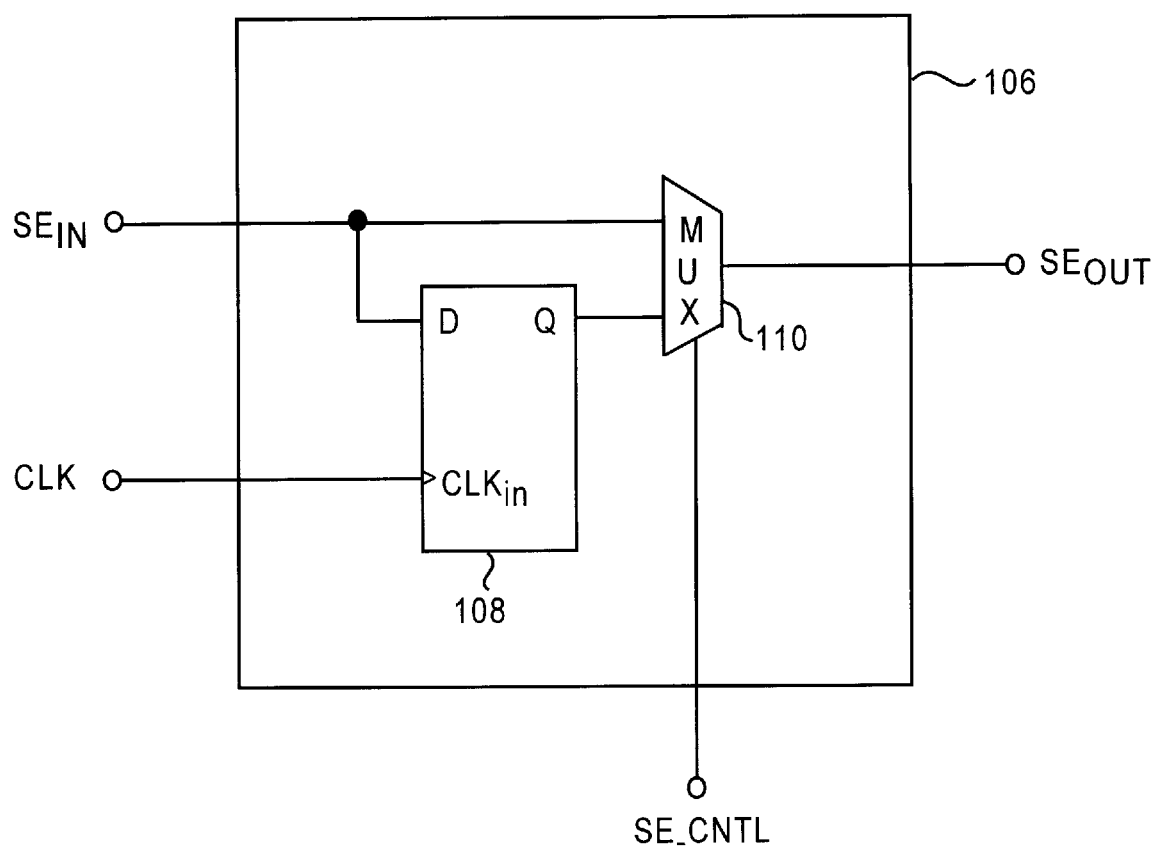
FIG. 5 illustrates a preferred embodiment of a scan enable distribution circuit.

FIG. 5 illustrates a preferred embodiment of a scan enable distribution circuit 106. The scan enable distribution circuit 106 includes a flip-flop 108 and a multiplexer 110. Although the flip-flop 108 is illustrated as a D-type flip-flop, other flip-flops or other sequential circuits may be used therefor. The input terminal (D) of the flip-flop 108 receives the scan enable signal ($SE_{IN}$) being supplied to the scan enable distribution circuit 106. The output from the scan enable distribution circuit 106 is the scan enable signal ($SE_{OUT}$) being output from the multiplexer 110. The clock terminal (CLKin) of the flip-flop 108 receives a clock signal (CLK). A scan enable control signal (SE_CNTL) controls the multiplexer 110 to switch between a slow scan test mode and a fast scan test mode. In the slow scan test mode, the input scan enable signal ($SE_{IN}$) is passed directly through the scan enable distribution circuit 106 and output as the output scan enable signal ($SE_{OUT}$). In this mode, conventional (slow) scan testing can be performed. On the other hand, when the scan enable control signal (SE_CNTL) selects the fast scan test mode, the multiplexer 110 supplies the output of the flip-flop 108 as the output scan enable signal ($SE_{OUT}$).

The scan distribution circuit 106 illustrated in FIG. 5 is suitable for use with either the first or second embodiments of the invention discussed above. It should be noted that integrated circuits constructed in accordance with the first embodiment as well as the second embodiment are capable of operating in a fast scan test mode or a slow scan test mode in addition to the regular functional mode of the integrated circuit. However, if the particular embodiment of the invention desires only to perform fast scan testing and not slow scan testing, then the scan enable distribution circuit 106 may be modified to eliminate the multiplexer 110.

Figure 6:
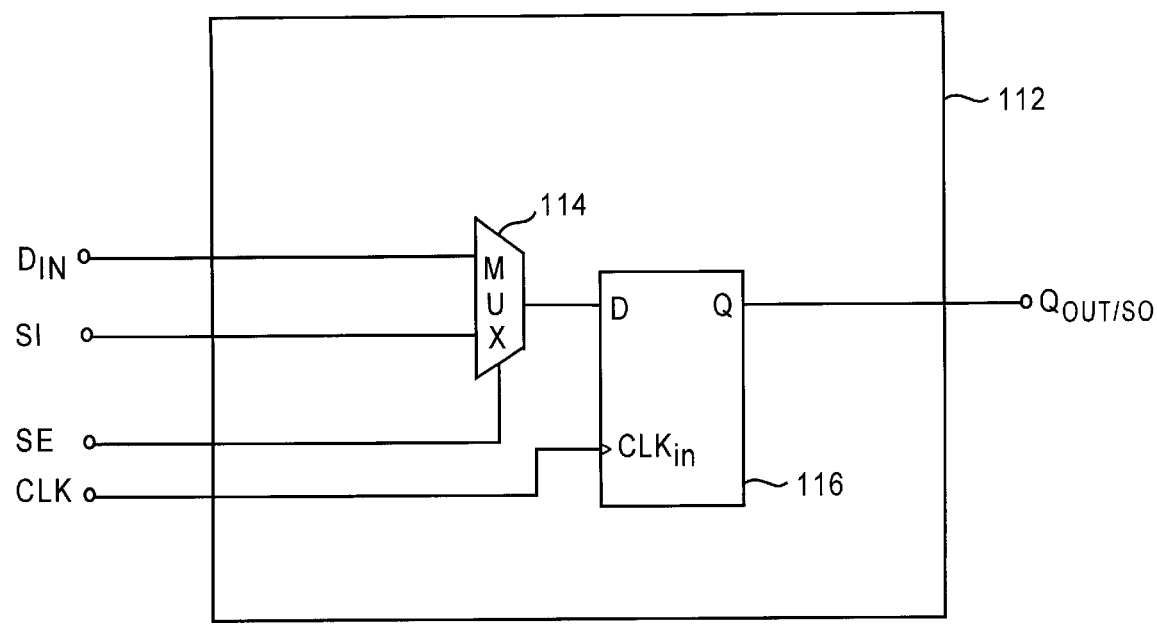
FIG. 6 and 7 illustrate representative conventional designs for scan circuits used in scan testing.
Figure 7:
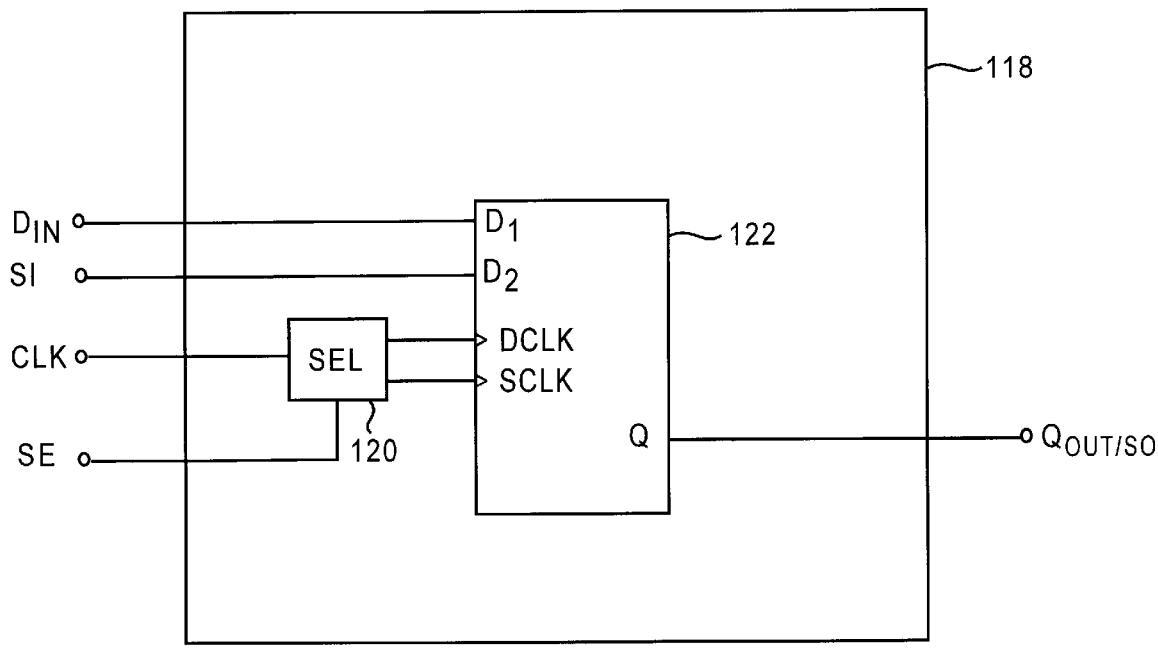

FIG. 6 and 7 illustrate representative conventional designs for the scan circuits used in scan testing. In FIG. 6, a scan circuit 112 includes a multiplexer 114 and a flip-flop 116. The multiplexer 114 supplies either a functional data input ($D_{IN}$) or SI (scan input) to the input terminal (D) of the flip-flop 116 in accordance with a scan enable signal (SE). A clock signal (CLK) is supplied to a clock terminal (CLKin) of the flip-flop 116. At a rising edge of the clock signal (CLK), the input signal residing at the input terminal (D) of the flip-flop 116 is supplied at the output terminal (Q) of the flip-flop 116. The signal at the output terminal (Q) is then the output of the scan circuit 112 $Q_{OUT}$/SO (scan output).

In FIG. 7, the scan circuit 118 operates in a similar fashion as the scan circuit 112 shown in FIG. 6, but includes two different clock inputs (so called dual-clock design), one for scan mode and one for normal mode. The scan circuit 118 includes a selector 120 and a flip-flop 122. In this embodiment, the selector 120 supplies a clock signal (CLK) to either a normal clock input terminal (DCLK) or a scan clock input terminal (SCLK) in accordance with a scan enable signal (SE). Functional data ($D_{IN}$) is supplied to a first data terminal ($D_1$) and SI is supplied to a second data input terminal ($D_2$) of the flip-flop 122. The output ($Q_{OUT}$/SO) of the scan circuit 118 is the output ($Q_{OUT}$) of the flip-flop 122, which is either the functional data or the scan output (SO). The functional clock is distributed to provide proper circuit at system frequencies. See, e.g., G.M. Blair, "Skew-Free Clock Distribution for Standard-Cell VLSI Designs," IEE Proceedings, April 1992. If the scan circuits follow the dual-clock design, then the scan clock (SCLK) from the clock header (selector 120) to the flip-flops (122) must also be carefully distributed in a similar manner.

The particular distribution network used to distribute the scan enable signal within an integrated circuit can take many forms. For a given device, the actual implementation of the distribution network will depend on parameters such as the physical location of the scan flip-flops/clock headers, the interconnect delays, and the degree of pipelining to satisfy cycle times. For example an H-tree can be used in distributing the scan enable signal to ensure minimal skew at the respective destinations. See, e.g., H.B. Bakoglu, "Circuits, Interconnections, and Packaging for VLSI," Addison-Wesley VLSI System Series, 1990, pp. 367–79. Timing checks and proper buffering of the interconnect between the enable distribution circuits must ensure uniform propagation of the scan enable signal at rated functional clock speeds. The scan enable signal must also be set-up for the next edge of the clock.

Figure 8:
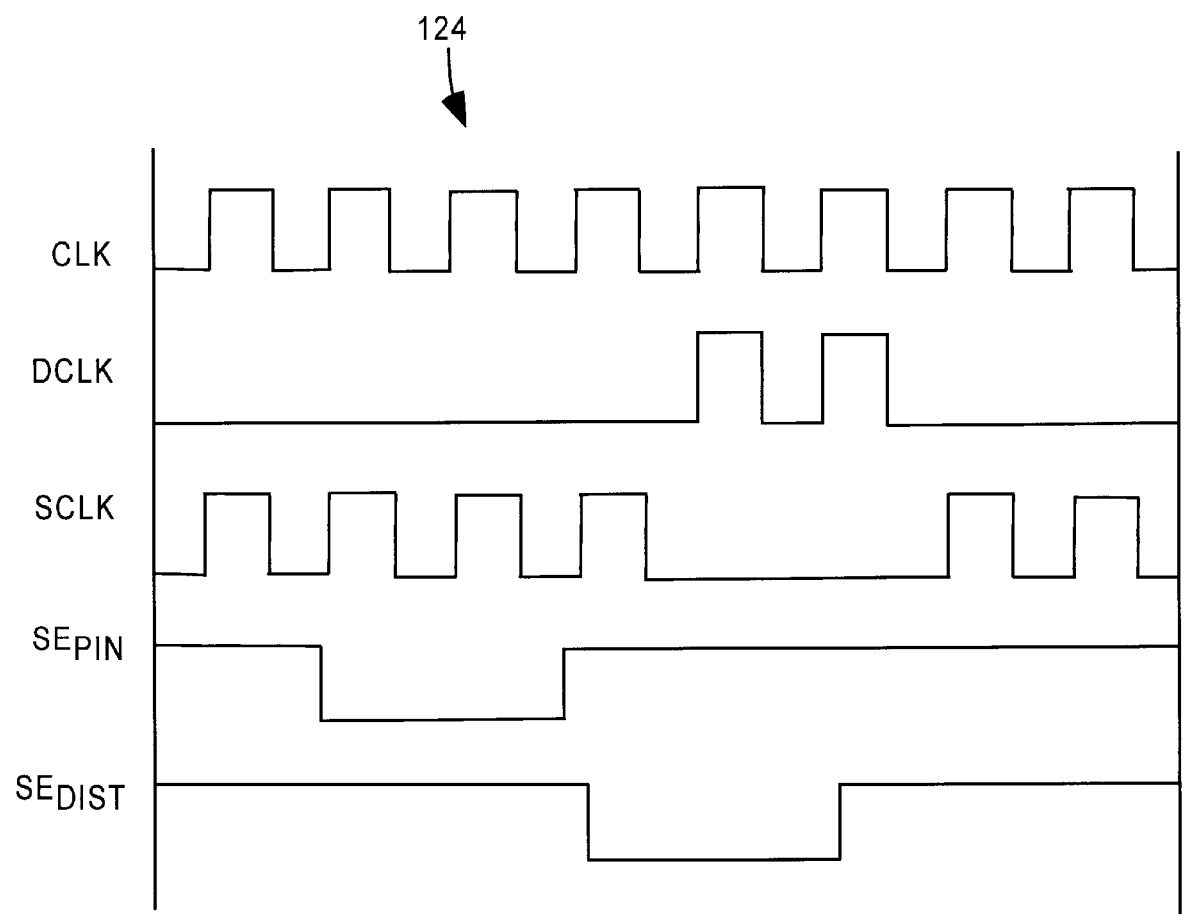
FIGS. 8 and 9 are timing diagrams illustrating latency of a scan enable signal at a pin and at scan circuits during high speed scan delay testing.
Figure 9:
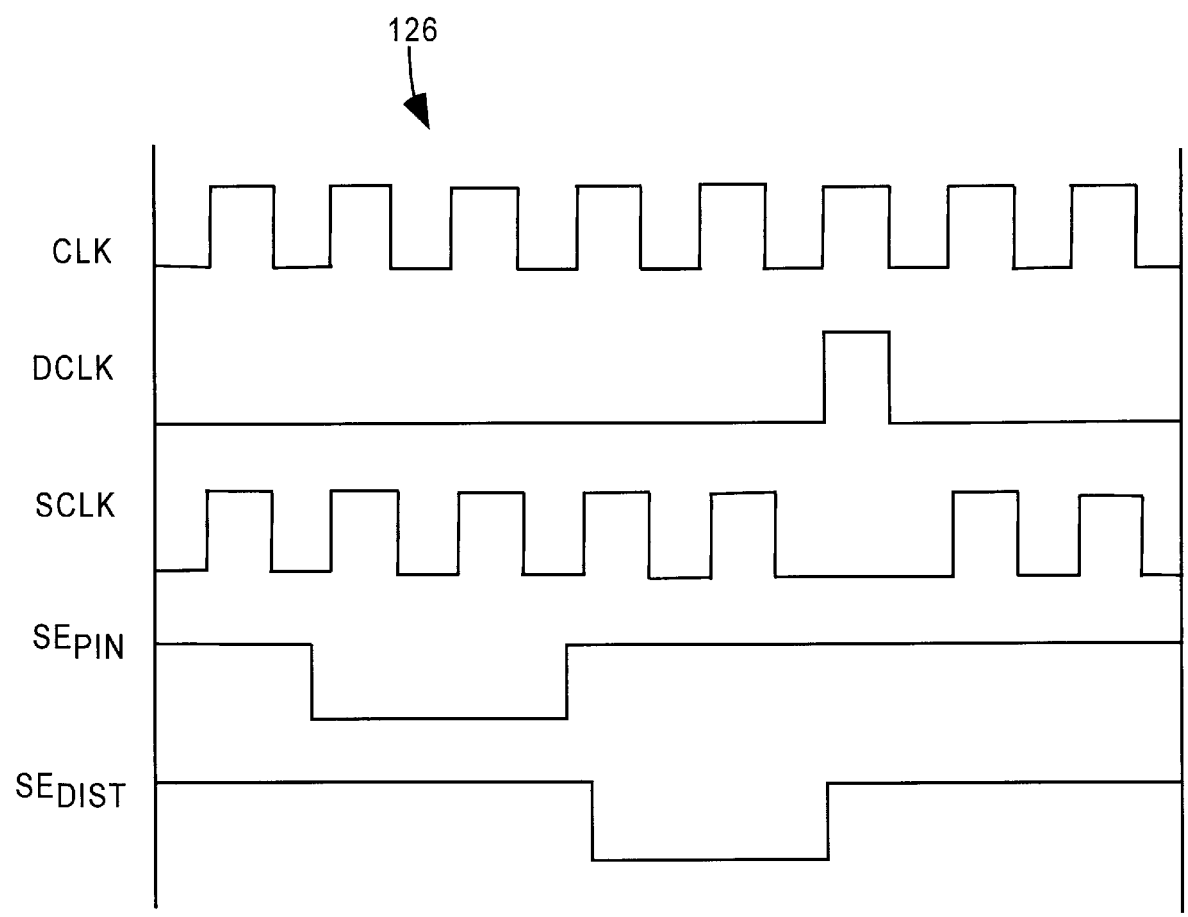

The use of the scan circuit distribution circuits introduces a latency between assertion/deassertion of the scan enable signal at the pin, and at the scan circuits. The latency between the scan enable at the pin, and at the scan circuits is based on the particular distribution network. FIGS. 8 and 9 are timing diagrams 124 and 126 that illustrate latency of the scan enable signal between the pin and the scan circuits during high speed scan delay testing. In FIG. 8, the timing diagram 124 of the signals illustrate the case of applying a broadside delay test pattern. Note that the latency of the scan enable signal (SE) from the pin ($SE_{PIN}$) to the scan circuit ($SE_{DIST}$) is equal to two (2) clock cycles, and that the normal clock (DCLK) is clocked twice at the appropriate time after the scan clock (SCLK) shifts in the test pattern. In FIG. 9, the timing diagram 126 of the signals illustrate the case of applying a skewed load delay test pattern. Note that the latency of the scan enable signal (SE) from the pin ($SE_{PIN}$) to the scan circuit ($SE_{DIST}$) is also equal to (2) clock cycles, and that the normal clock (DCLK) is clocked once at the appropriate time after the scan clock (SCLK) shifts in the test pattern and applies an extra clock. The scan circuits in the integrated circuit design are assumed to be dual-clock scan flip-flops, an example of which is illustrated in FIG. 7.

The invention does not require the use of a phase-locked loop (PLL) within the integrated circuit. A PLL could be used to synchronize the clock at the pins with the clock used within the circuitry. However, when no PLL is provided, the tester can externally synchronize timings at the pins during scan testing.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An integrated circuit chip supporting scan testing in a test mode and functional operation in a functional mode, said integrated circuit comprising:

functional circuitry;
   a plurality of scan circuits residing on said integrated circuit chip, said scan circuits being coupled to said functional circuitry in the functional mode and being coupled to one another to form at least one serial chain in the test mode; and a plurality of scan enable distribution circuits residing on said integrated circuit for distributing a scan enable signal to said scan circuits, the scan enable signal being operable to switch said scan circuits between the test mode and the functional mode.

2. An integrated circuit as recited in claim 1, wherein the scan enable signal passes through a predetermined number of said scan enable distribution circuits before reaching said scan circuits.

3. An integrated circuit as recited in claim 1, wherein the integrated circuit chip has a surface area, and wherein said scan enable distribution circuits are distributed across the surface area of the integrated circuit chip.

4. An integrated circuit as recited in claim 3, wherein the distribution of said scan enable distribution circuits takes the form of a H-Tree distribution.

5. An integrated circuit as recited in claim 3, wherein the distribution of said scan enable distribution circuits takes the form of a star distribution.

6. An integrated circuit as recited in claim 3, wherein for each of said scan circuits, a particular one of said scan enable distribution circuits supplying the scan enable signal thereto is positioned proximate to said scan circuit on the integrated circuit chip.

7. An integrated circuit as recited in claim 6, wherein a signal delay for sending the scan enable signal from the particular one of said scan enable distribution circuits to one or more of said scan circuits coupled thereto is less than a predetermined amount so as to facilitate high speed scan testing.

8. An integrated circuit supporting scan testing in a test mode and functional operation in a functional mode, said integrated circuit comprising:

functional circuitry;

a plurality of scan circuits residing on said integrated circuit chip, said scan circuits being coupled to said functional circuitry in the functional mode and being coupled to one another to form at least one serial chain in the test mode: and a plurality of scan enable distribution circuits residing on said integrated circuit for distributing a scan enable signal to said scan circuits, the scan enable signal being operable to switch said scan circuits between the test mode and the functional mode, wherein said scan enable distribution circuit includes at least a sequential circuit having an input terminal receiving an input scan enable signal, a clock terminal for receiving a clock signal, and an output terminal; and a selector having a first input terminal receiving the input scan enable signal, a second input terminal coupled to the output terminal of said sequential circuit, a select terminal for receiving a scan control signal, and an output terminal for outputting an output scan enable signal.

9. An integrated circuit as recited in claim 8, wherein said sequential circuit is a flip-flop.

10. An integrated circuit chip having a pipelined scan enable architecture, said integrated circuit chip comprising:

a plurality of scan circuits, each of said scan circuits including at least a data input terminal, a clock terminal, a scan enable terminal, a scan data input terminal, and an output terminal; and a plurality of scan enable distribution circuits, wherein a scan enable signal passes through a predetermined number of said scan enable distribution circuits prior to reaching the scan enable terminals of said scan circuits.

11. An integrated circuit chip as recited in claim 10, wherein said scan enable distribution circuits operate as sequential circuits in accordance with a clock.

12. An integrated circuit chip as recited in claim 10, wherein each of said scan enable distribution circuits operate in first and second modes to receive scan data and output scan data, wherein, in the first mode, the received scan data passes through said scan enable distribution circuit and becomes the output scan data, and wherein, in the second mode, the received scan data becomes the output scan data synchronized with a clock signal received by said scan enable distribution circuit.

13. An integrated circuit chip as recited in claim 10, wherein each of said scan enable distribution circuits comprise:

a sequential circuit having an input terminal receiving an input scan enable signal, a clock terminal for receiving a clock signal, and an output terminal; and a selector having a first input terminal receiving the input scan enable signal, a second input terminal coupled to the output terminal of said sequential circuit, a select terminal for receiving a scan control signal, and an output terminal for outputting an output scan enable signal.

14. A method for scan testing an integrated circuit chip having functional logic, said method comprising:

(a) providing a plurality of scan circuits within the integrated circuit chip, each of the scan circuits having a functional mode and a scan mode;

(b) providing a plurality of scan enable distribution circuits within the integrated circuit chip, the scan enable distribution circuits being distributed within the integrated circuit chip;

(c) receiving a scan enable signal;

(d) supplying the scan enable signal to each of the scan circuits through the scan enable distribution circuits so that the scan enable signal in route to the scan circuits passes through an equal number of the scan enable distribution circuits;

(e) setting the scan circuits to the scan mode using the scan enable signal;

(f) receiving test data;

(g) shifting the test data through the scan circuits;

(h) setting the scan circuits to the functional mode using the scan enable signal;

(i) obtaining resultant data from the functional logic of the integrated circuit;

(j) setting the scan circuits to the scan mode using the scan enable signal; and (k) shifting out the resultant data.

15. A method as recited in claim 14, wherein the scan enable distribution circuits form a pipeline through which the scan enable signal traverses in route to each of the scan circuits in accordance with a clock signal.

16. A scan enable distribution circuit for distributing a scan enable signal within an integrated circuit, said scan enable distribution circuit enables the integrated circuit to be scan tested in a fast mode or in a slow mode, said scan enable distribution circuit comprises:

a sequential circuit having an input terminal receiving an input scan enable signal, a clock terminal for receiving a clock signal, and an output terminal; and a selector having a first input terminal receiving the input scan enable signal, a second input terminal coupled to the output terminal of said sequential circuit, a select terminal for receiving a scan mode select signal that selects one of the fast mode and the slow mode, and an output terminal for outputting an output scan enable signal, wherein, in the slow mode, the output scan enable signal is the input scan enable signal, and in the fast mode, the output scan enable signal is the signal output from the output terminal of said sequential circuit.

17. A scan enable distribution circuit as recited in claim 16, wherein said sequential circuit is a flip-flop.

18. A scan enable distribution circuit as recited in claim 16, wherein, in the slow mode, the scan testing is performed in accordance with IEEE Standard 1149.1.

* * * * *